(12) United States Patent
Lee

(10) Patent No.: US 11,688,928 B2
(45) Date of Patent: Jun. 27, 2023

(54) STRUCTURE FOR BLOCKING NOISE IN AT LEAST ONE DESIGNATED BAND AND ELECTRONIC DEVICE COMPRISING SAME

(71) Applicant: Samsung Electronics Co., Ltd., Gyeonggi-do (KR)

(72) Inventor: Junho Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 16/957,158

(22) PCT Filed: Dec. 21, 2018

(86) PCT No.: PCT/KR2018/016496
§ 371 (c)(1),
(2) Date: Jun. 23, 2020

(87) PCT Pub. No.: WO2019/132448
PCT Pub. Date: Jul. 4, 2019

(65) Prior Publication Data
US 2020/0373647 A1  Nov. 26, 2020

(30) Foreign Application Priority Data
Dec. 28, 2017 (KR) .................. 10-2017-0182912

(51) Int. Cl.
*H01Q 1/22* (2006.01)
*H01K 1/02* (2006.01)
(Continued)

(52) U.S. Cl.
CPC .......... *H01Q 1/2283* (2013.01); *H01Q 1/243* (2013.01); *H05K 1/0216* (2013.01); *H05K 1/0243* (2013.01)

(58) Field of Classification Search
CPC ........ H01Q 1/24; H01Q 1/243; H01Q 1/2283; H01Q 21/28; H01Q 1/22; H01Q 1/38;
(Continued)

(56) References Cited

U.S. PATENT DOCUMENTS

2006/0192713 A1  8/2006  Kwak et al.
2011/0012697 A1  1/2011  Takemura et al.
(Continued)

FOREIGN PATENT DOCUMENTS

JP           2661568 B2    10/1997
KR    10-2006-0094603 A    8/2006
(Continued)

OTHER PUBLICATIONS

Korean Search Report dated Dec. 25, 2021.
Notice of Patent Grant dated Apr. 29, 2022.

*Primary Examiner* — Thai Pham
(74) *Attorney, Agent, or Firm* — Cha & Reiter, LLC

(57) ABSTRACT

An electronic device according to various embodiments may include a housing, an antenna structure positioned in the housing, and a wireless communication circuit. The antenna structure may include a first conductive layer including a first opening, a second conductive layer positioned in parallel with the first conductive layer, and including a second opening which overlaps at least in part with the first opening when the first conductive layer is seen from above, a third conductive layer positioned in parallel with the first conductive layer and interposed between the first conductive layer and the second conductive layer, a first insulating layer interposed between the first conductive layer and the third conductive layer, a second insulating layer interposed between the second conductive layer and the third conductive layer, a first conductive plate electrically separated from the first conductive layer and disposed within the first opening, a second conductive plate electrically separated
(Continued)

from the second conductive layer and disposed within the second opening, a first conductive via electrically coupled between the first conductive plate and the third conductive layer through the first insulating layer, and a second conductive via electrically coupled between the second conductive plate and the third conductive layer through the second insulating layer. The wireless communication circuit may be configured to transmit or receive a signal having a frequency between 3 Giga Hertz (GHz) and 100 GHz and is electrically coupled to the antenna structure. Various embodiments may be possible.

8 Claims, 13 Drawing Sheets

(51) Int. Cl.
*H01Q 1/24* (2006.01)
*H05K 1/02* (2006.01)

(58) Field of Classification Search
CPC ............... H05K 1/0243; H05K 1/0216; H05K 2201/09345; H05K 1/02; H05K 2201/09718; H05K 2201/09854
See application file for complete search history.

(56) References Cited

U.S. PATENT DOCUMENTS

| 2012/0112868 | A1* | 5/2012 | Wu ........................ H05K 1/165 |
| | | | 29/829 |
| 2013/0088396 | A1* | 4/2013 | Han ........................ H01Q 9/04 |
| | | | 343/700 MS |
| 2017/0201011 | A1 | 7/2017 | Khripkov et al. |
| 2018/0146543 | A1* | 5/2018 | Chen ..................... H05K 1/0219 |

FOREIGN PATENT DOCUMENTS

| KR | 10-2010-0043492 A | 4/2010 |
| KR | 10-2013-0037083 A | 4/2013 |
| KR | 10-2015-0041054 A | 4/2015 |
| KR | 10-2017-0083949 A | 7/2017 |

\* cited by examiner

STRUCTURE FOR BLOCKING NOISE IN AT LEAST ONE DESIGNATED BAND AND ELECTRONIC DEVICE COMPRISING SAME

CROSS-REFERENCE TO RELATED APPLICATION(S)

This application is a National Phase Entry of PCT International Application No. PCT/KR2018/016496, which was filed on Dec. 21, 2018 and claims priority to Korean Patent Application No. 10-2017-0182912, which was filed on Dec. 28, 2017, the contents of which are incorporated herein by reference.

TECHNICAL FIELD

Various embodiments relate to a structure for blocking noise on at least one designated band, and an electronic device including the structure.

BACKGROUND ART

To meet a demand on wireless data traffic which has been in an increasing trend after a $4^{th}$ Generation (4G) communication system was commercialized, there is an ongoing effort to develop a next-generation communication system.

To achieve a high data transfer rate, the next-generation communication system is considered to be implemented in a millimeter Wave (mmWave) band. To reduce a propagation path loss at the mmWave band and to increase a propagation delivery distance, beamforming, massive Multiple Input Multiple Output (MIMO), full dimensional MIMO (FD-MIMO), array antenna, analog beam-forming, and large-scale antenna techniques are under discussion in the next-generation communication system.

DISCLOSURE OF INVENTION

Technical Problem

A decoupling capacitor or a ground via may be used to block coupling between a power area in a Printed Circuit Board (PCB) and a ground area in the PCB. The decoupling capacitor or the ground via may be used to decrease impedance on a band less than or equal to a designated frequency, but may not be able to decrease impedance on a band (e.g., a mmWave band) exceeding the designated frequency). Therefore, there may be a need for a structure for decreasing or removing the impedance on the mmWave band in the PCB.

Technical problems to be achieved in the disclosure are not limited to the technical problems mentioned above, and other technical problems not mentioned herein can be clearly understood by those skilled in the art to which the disclosure pertains from the following descriptions.

Solution to Problem

An electronic device according to various embodiments may include a housing, an antenna structure positioned in the housing, and a wireless communication circuit. The antenna structure may include a first conductive layer including a first opening, a second conductive layer positioned in parallel with the first conductive layer, and including a second opening which overlaps at least in part with the first opening when the first conductive layer is seen from above, a third conductive layer positioned in parallel with the first conductive layer and interposed between the first conductive layer and the second conductive layer, a first insulating layer interposed between the first conductive layer and the third conductive layer, a second insulating layer interposed between the second conductive layer and the third conductive layer, a first conductive plate electrically separated from the first conductive layer and disposed within the first opening, a second conductive plate electrically separated from the second conductive layer and disposed within the second opening, a first conductive via electrically coupled between the first conductive plate and the third conductive layer through the first insulating layer, and a second conductive via electrically coupled between the second conductive plate and the third conductive layer through the second insulating layer. The wireless communication circuit may be configured to transmit or receive a signal having a frequency between 3 Giga Hertz (GHz) and 100 GHz and is electrically coupled to the antenna structure.

A Printed Circuit Board (PCB) according to various embodiments may include an insulating layer, a first conductive layer disposed on the insulating layer and including a ground area and an opening disposed within the ground area, a second conductive layer disposed under the insulating layer and configured to apply voltage, a conductive via pad disposed within the opening and spaced from the ground area, and a conductive via disposed in the insulating layer, and configured to electrically couple the conductive via pad and the second conductive layer. The conductive via pad may be electrically separated from the ground area.

An antenna structure according to various embodiments may include at least one circuitry related to wireless communication and a PCB operatively coupled with the at least one circuitry. The PCB may include an insulating layer, a first conductive layer in contact with a surface of the insulating layer and including a ground area and a plurality of openings disposed within the ground area, a second conductive layer in contact with another surface of the insulating layer and configured to apply voltage, a plurality of conductive pads disposed respectively within the plurality of openings and spaced from the ground area, and a plurality of conductive vias disposed in the insulating layer and configured to electrically couple the respective plurality of conductive via pads and the second conductive layer.

Advantageous Effects of Invention

According to various embodiments, a structure and an electronic device including the structure can decrease noise on a designated band.

Advantages acquired in the disclosure are not limited to the aforementioned advantages. Other advantages not mentioned herein can be clearly understood by those skilled in the art to which the disclosure pertains from the following descriptions.

BEST MODE FOR CARRYING OUT THE INVENTION

Figure 1:
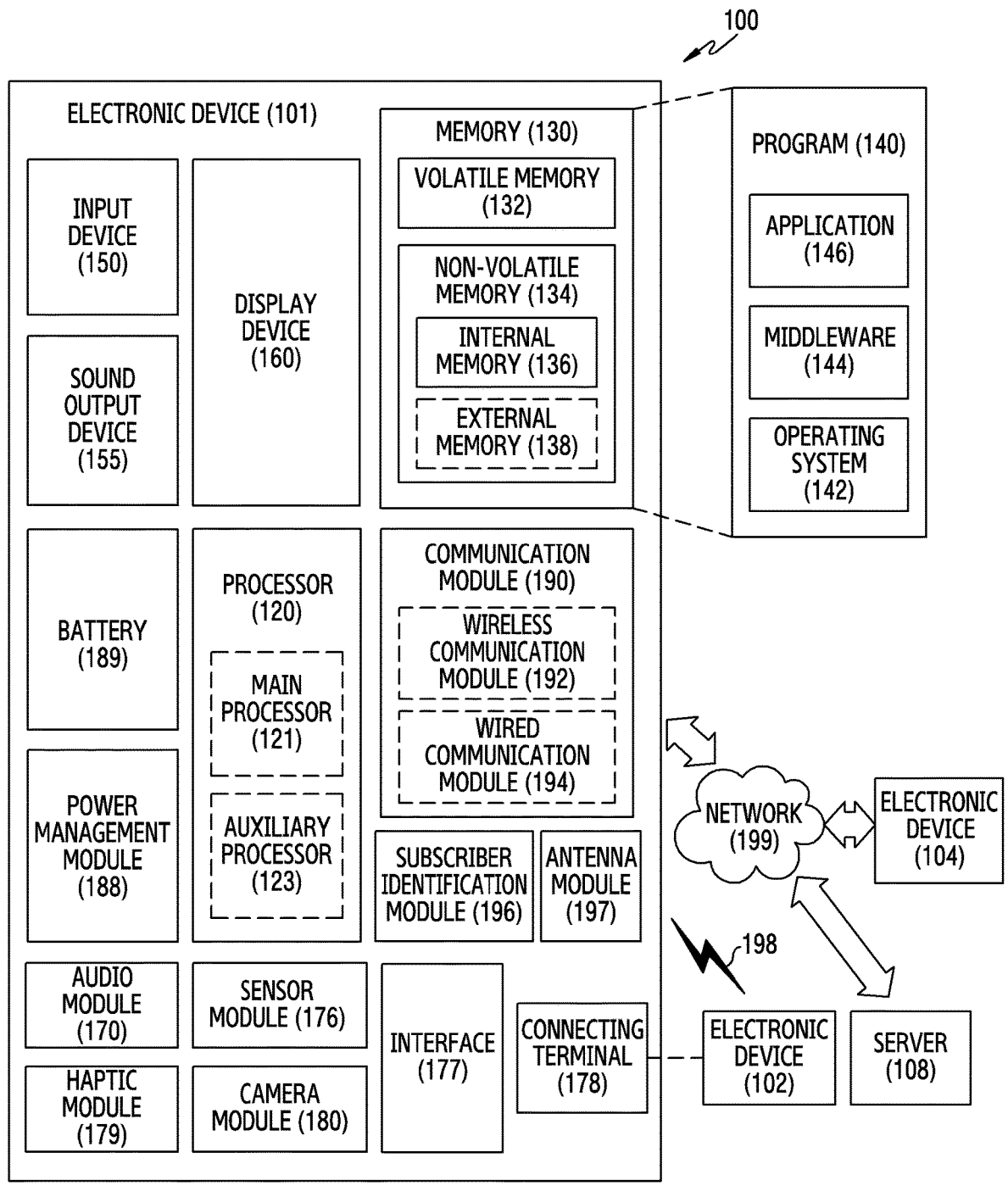
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls.

According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101.

According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of -antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101)—. For example, a processor_(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added.

Figure 2A:
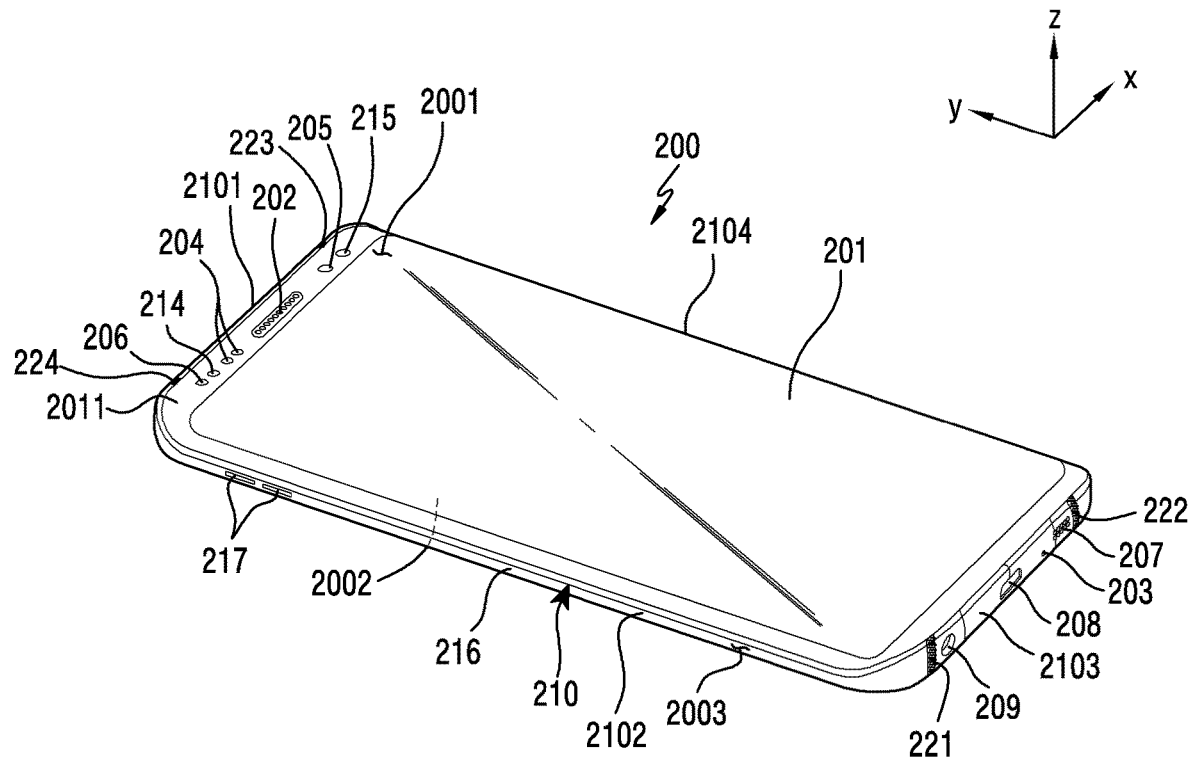
FIG. 2A is a perspective view of electronic devices according to various embodiments of the disclosure.
Figure 2B:
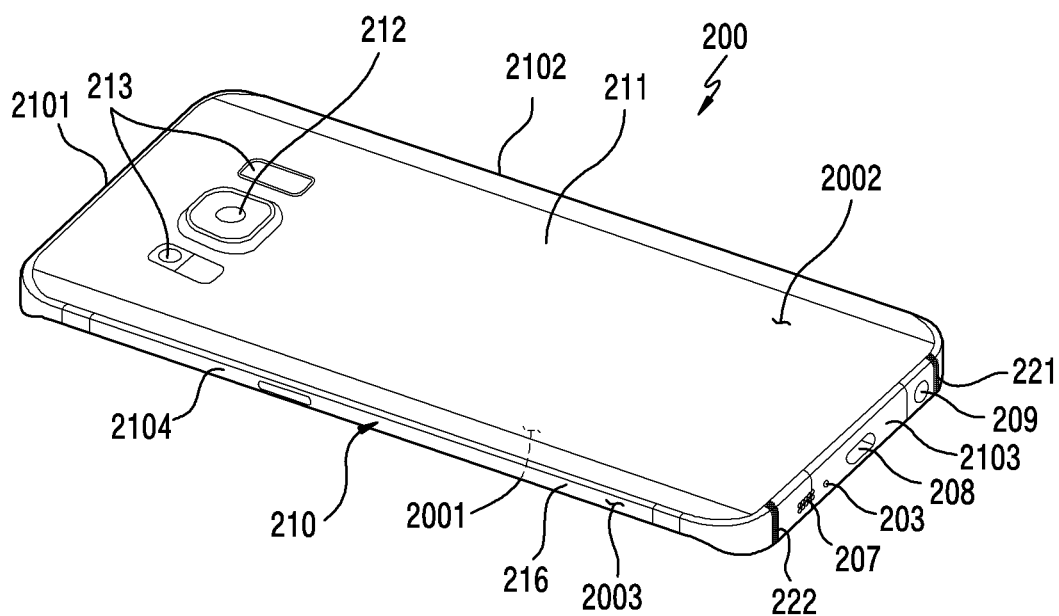
FIG. 2B is a perspective view of electronic devices according to various embodiments of the disclosure.

Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added FIG. 2A is a perspective view of electronic devices according to various embodiments of the disclosure. FIG. 2B is a perspective view of electronic devices according to various embodiments of the disclosure.

FIG. 2A may be a front perspective view of electronic devices. FIG. 2B may be a rear perspective view of electronic devices.

An electronic device 200 of FIG. 2A and FIG. 2B may be similar at least in part to the electronic device 101 of FIG. 1, or may include other embodiments of the electronic device.

Referring to FIG. 2A and FIG. 2B, the electronic device 200 may include a housing 210. According to an embodiment, the housing 210 may be formed of a conductive member and/or a non-conductive member. According to one embodiment, the housing 210 is disposed in a direction opposite to the first surface 2001 (e.g., front or top surface), the first surface 2001 facing the first direction (e.g., Z-axis direction) It may include a second surface 2002 (e.g., a rear or bottom surface) and a side surface 2003 disposed in a manner surrounding at least a portion of the first surface 2001 and the second surface 2002. According to one embodiment, the side surface 2003 is coupled to the front plate 2011 (e.g., a glass plate or polymer plate comprising various coating layers) and the rear plate 211, and includes metal and/or polymer It can be formed by the side member 216. For example, the rear plate 211 may be constructed, for example, and without limitation, of coated or colored glass, ceramic, polymer, metallic materials (e.g. aluminum, stainless steel (STS), or magnesium), a combination of at least two of these materials, or the like.

According to various embodiments, the side surface 2003 is coupled to the front plate 2011 and the back plate 211, and is formed by a side member 216 (or side bezel structure) including metal and/or polymer. In some embodiments, the rear plate 211 and the side member 216 may be integrally formed and include the same material (e.g., a meatal material such as aluminum or magnesium). According to an embodiment, the housing 210 may include a first portion 2101 having a first length, a second portion 2102 extending in a direction orthogonal to the first portion 2101 and having a second length, a third portion 2103 extending to have the first length in parallel with the first portion 2101, and a fourth portion 2104 extending from the third portion 2103 to have a second length in parallel with the second portion 2102. According to an embodiment, the first portion 2101 may have a unit conductive portion 2101 electrically isolated by a pair of non-conductive portions 223 and 224 spaced from each other by a predetermined distance. In addition, the third portion 2103 may also have a unit conductive portion 2103 electrically isolated by a pair of non-conductive portions 221 and 222 spaced from each other by a predetermined distance. However, without being limited thereto, the first portion 2101 and the third portion 2103 formed as a unit conductive portion may be formed by one or more non-conductive portions. The conductive portions 2101 and 2103 electrically isolated may be electrically coupled with a communication circuit (e.g., a communication circuit 390 of FIG. 3) disposed inside the electronic device 200, and may be utilized as antennas operating in at least one resonant frequency band.

According to various embodiments, the electronic device 200 may include the front plate 2011 (e.g., a window or a glass plate) disposed to the first surface 2001, and a display 201 (e.g., a touchscreen display) disposed to be exposed through at least some regions of the front plate 2011. According to one embodiment, the display 201 includes a touch sensing circuit, a pressure sensor capable of measuring the intensity (pressure) of the touch, and/or a pen detection sensor (e.g., a digitizer) for detecting a magnetic field type stylus pen that can be combined or placed adjacent.

According to various embodiments, the electronic device 200 may include a communication receiver hole 202. According to an embodiment, the electronic device 200 may be controlled to use a speaker disposed therein to speak with the other party through the communication receiver hole 202. According to an embodiment, the electronic device 200 may include a microphone hole 203. According to an embodiment, the electronic device 200 may use at least one microphone disposed therein and capable of sensing a sound direction, and may receive an external sound through the microphone hole 203 or transmit a user's voice to the other party.

According to various embodiments, the electronic device 200 may include at least one key input device 217. According to one embodiment, the key input device 217 may include at least on side key button 217 disposed on the side surface 2003 of the housing 210. According to an embodiment, the at least one side key button 217 may include a volume control button, a wake-up button, or a button for performing a specific function (e.g., a function of executing artificial intelligence, a function of entering a fast speech recognition execution mode, etc.).

According to various embodiments, the electronic device 200 may include components for performing various functions of the electronic device 200 by being exposed to the display 201 or by being disposed not to be exposed while performing a function through the front plate 2011. According to an embodiment, at least part of the components may be disposed to be in contact with an external environment from the inside of the electronic device through at least one portion of the front plate 2011 of a transparent material. According to an embodiment, the components may include at least one sensor module 204. The sensor module 204 may include, for example, an illumination sensor (e.g., an optical sensor), a proximity sensor (e.g., an optical sensor), an infrared sensor, an ultrasonic sensor, a fingerprint sensor, a face recognition sensor, an EM sensor, or an iris recognition sensor. According to an embodiment, the component may include a first camera device 205. According to an embodiment, the component may include an indicator 206 (e.g., an LED device) for visually presenting status information of the electronic device 200 to a user. According to an embodiment, the component may include a light source 214 (e.g., an infrared LED) disposed to one side of the receiver 202. According to an embodiment, the component may include an imaging sensor assembly 215 (e.g., an iris camera) to detect an iris image in a state where light generated from the light source 214 is irradiated around a user's eye. According to an embodiment, at least one of these components may be disposed to be exposed through at least some regions of the second surface 2002 (e.g., a rear surface or a back surface) facing a direction (e.g., −Z-axis direction) opposite to a first direction of the electronic device 200.

According to various embodiments, the electronic device 200 may include an external speaker hole 207. According to an embodiment, the electronic device 200 may use a speaker disposed therein to output a sound through the external speaker hole 207. According to an embodiment, the electronic device 200 may include a first connector hole 208 (e.g., an interface connector port) to charge the electronic device 200 by using a data transmission/reception function and external power provided by an external device. According to an embodiment, the electronic device 200 may include a second connector hole 209 (e.g., an ear jack assembly) to accommodate an ear jack of the external device.

According to various embodiments, the electronic device 200 may include the rear plate 211 (e.g., a rear window) disposed to the second surface 2002. According to an embodiment, a rear camera device 212 may be disposed to the rear plate 211. At least one electronic component 213 may be disposed around the rear camera device 212. According to an embodiment, the electronic component 213 may include at least one of an illumination sensor (e.g., an optical sensor), a proximity sensor (e.g., an optical sensor), an infrared sensor, an ultrasonic sensor, a heartrate sensor, a fingerprint recognition sensor, an EM sensor, and a flash device.

According to various embodiments, the display 201 may include a touch panel and display panel stacked on the rear surface of the front plate 2011. According to an embodiment, an image displayed through the display panel may be provided to the user through the front plate 2011 of a transparent material. According to an embodiment, various materials such as transparent glass or acrylic may be used as the front plate 2011.

According to various embodiments, the electronic device 200 may include a waterproof structure. According to an embodiment, the electronic device 200 may include at least one sealing member arranged therein for waterproofing. According to an embodiment, the at least one sealing member may be arranged between the display 201 and the side member 216 and/or between the side member 216 and the rear plate 211.

According to various embodiments, the electronic device 200 may include at least one communication device (e.g., a communication device 400 of FIG. 4A) which uses a millimeter wave (e.g., a band of at least 25 GHz) as an operating frequency band. According to an embodiment, the communication device may include an antenna array including a plurality of antenna elements disposed on a dielectric material (e.g., a substrate) at regular intervals, and the antenna array may serve to form a beam in at least one direction, and may transmit and receive signals in a beam forming direction through a communication circuit (e.g., Radio Frequency Integrated Circuits (RFICs) 311, 321, 331, and 341 of FIG. 3). According to an embodiment, a phase shifting means (e.g., a phase shifter) (not shown) may be included in the proximity of the communication device.

According to various embodiments, the at least one communication device may be disposed in each corner of the electronic device. However, without being limited thereto, the at least one communication device may be disposed in at least one portion of a rear surface and/or an edge of the electronic device. According to an embodiment, even when a mounting position of the communication device is changed in the electronic device through an appropriate disposition of the antenna array and the communication circuit, optimal radiation performance can be implemented by considering only a disposition direction without changing the design of the communication device.

Figure 3:
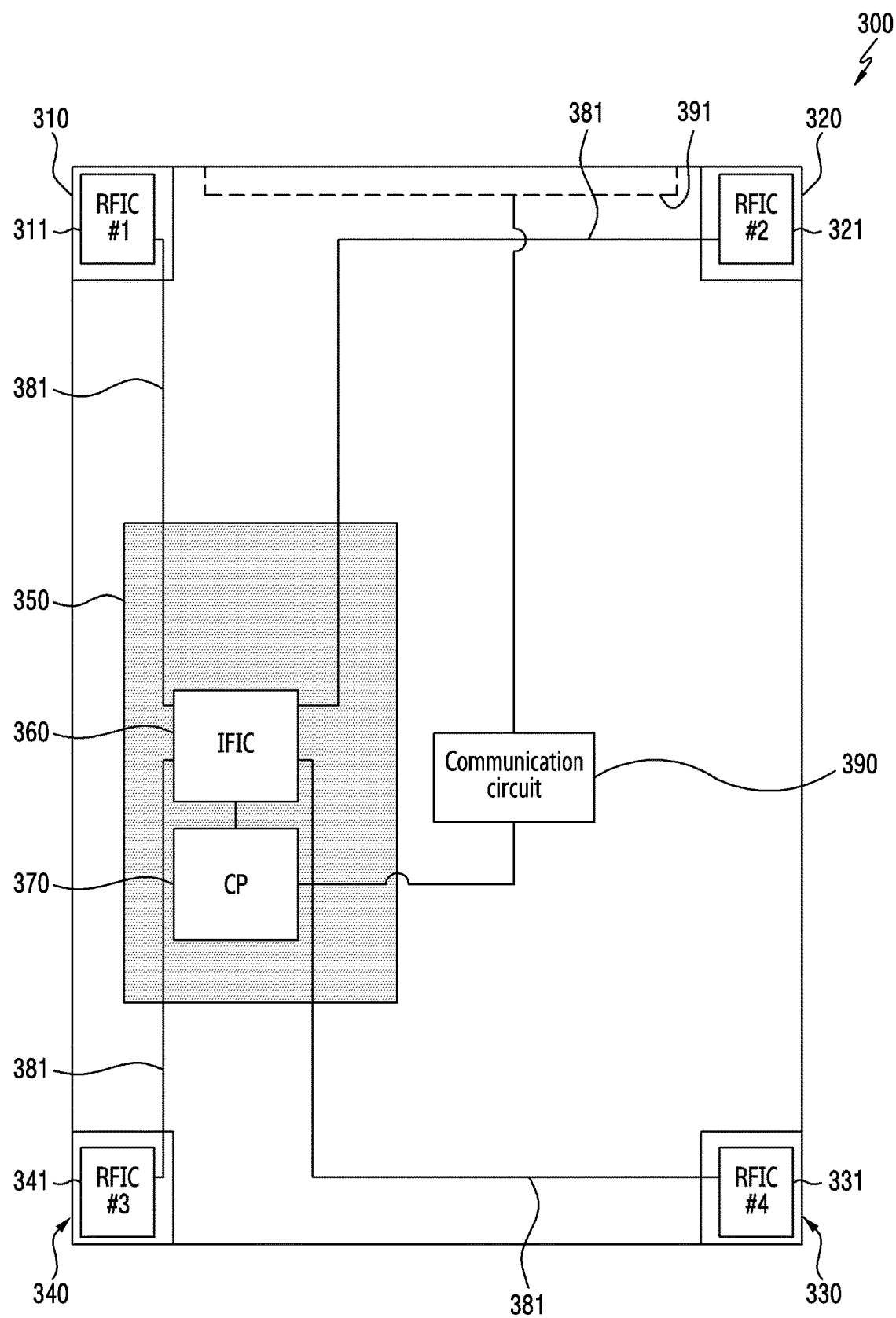
FIG. 3 is a view illustrating an arrangement relationship of a communication device in an electronic device according to various embodiments of the disclosure.

FIG. 3 is a view illustrating a disposition relationship of a communication device in an electronic device according to various embodiments of the disclosure.

According to an embodiment, an electronic device 300 of FIG. 3 may be similar at least in part to the electronic device 101 of FIG. 1 or the electronic device 200 of FIG. 2A, or may include other embodiments of the electronic device.

Referring to FIG. 3, the electronic device 300 may include one or more communication devices 310, 320, 330, and 340. According to an embodiment, the communication devices 310, 320, 330, and 340 may have antenna elements disposed on a substrate (i.e., a Printed Circuit Board (PCB)) at regular intervals in the form of at least one array, and may transmit and receive a signal for a designated direction through RFICs 311, 321, 331, and 341 disposed on the substrate. According to an embodiment, the antenna element may include a conductive member formed on the substrate in a patch type (or pattern type), or an antenna element of a dipole form.

According to various embodiments, the electronic device 300 may include a PCB 350 (e.g., a main PCB) mounted in an inner space. According to an embodiment, the electronic device 300 may include a communication module 370 (e.g., a Central Processor (CP)), an intermediate frequency IC 360 (e.g., IFIC), and a communication circuit, which are mounted on the PCB 350. According to an embodiment, the RFICs 311, 321, 331, and 341 disposed to the communication device may be electrically coupled with the intermediate frequency IC 360 through an electric connection member 381 (e.g., a coaxial cable). According to an embodiment, signals received through the communication devices 310, 320, 330, and 340 may be converted into intermediate frequency signals through the RFICs 311, 321, 331, and 341, and the intermediate frequency signals may be converted into a baseband frequency through the intermediate frequency IC 360 and may be provided to the processor 370.

According to various embodiments, a communication circuit 390 disposed on the PCB 350 may be electrically coupled to a conductive member 391 (e.g., the first portion 2101 of FIG. 2A) disposed in at least part of the electronic device, thereby transmitting and receiving a radio signal through the conductive member 391. According to an embodiment, the communication circuit 390 electrically coupled with the conductive member 391 may provide wireless communication ranging from around 500 MHz to 6000 MHz. According to an embodiment, the RFICs 311, 321, 331, and 341 included in the communication device 310, 320, 330, and 340 and electrically coupled with a plurality of antenna elements may provide wireless communication ranging from around 20 GHz to 100 GHz.

Figure 4A:
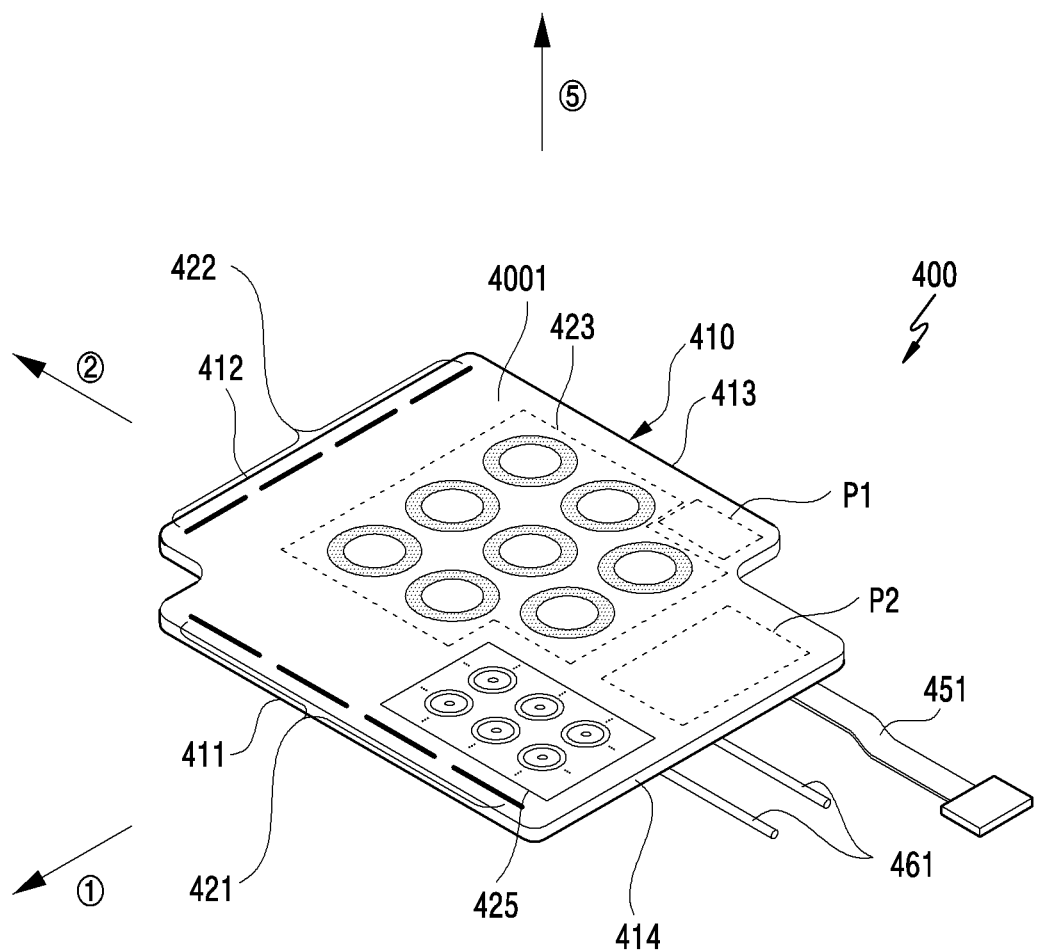
FIG. 4A is a perspective view illustrating a communication device according to various embodiments of the disclosure.
Figure 4B:
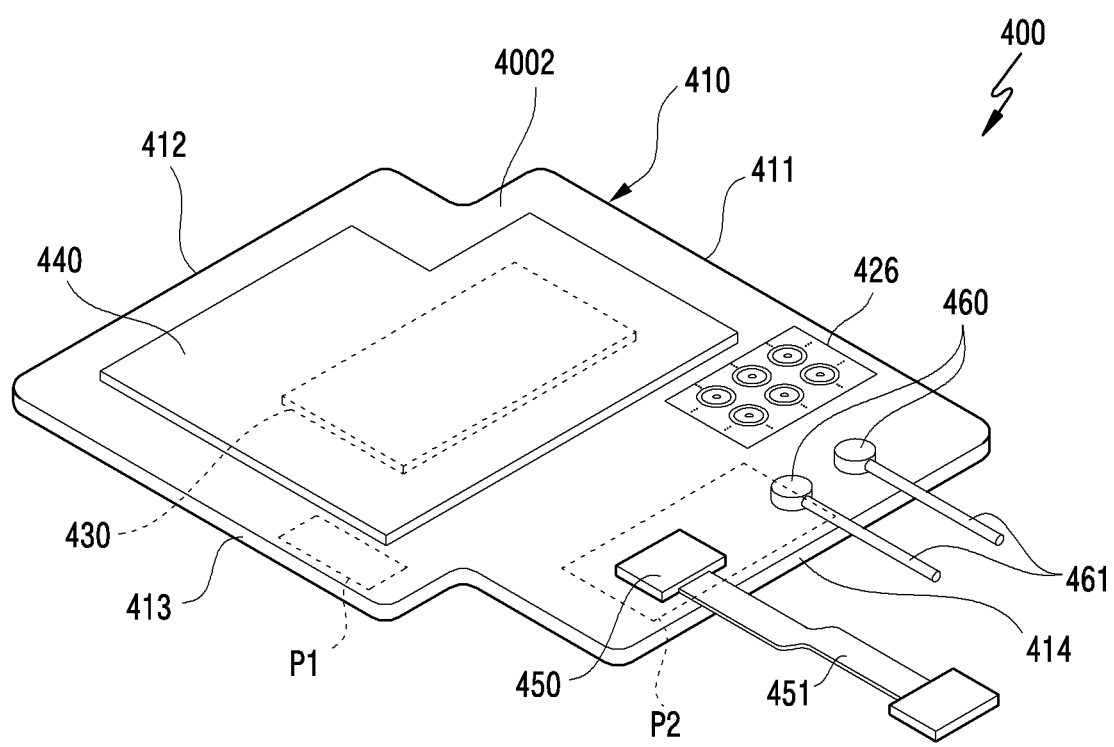
FIG. 4B is a perspective view illustrating a communication device according to various embodiments of the disclosure.

FIG. 4A and FIG. 4B are perspective views illustrating a communication device according to various embodiments of the disclosure.

According to an embodiment, a communication device 400 of FIG. 4A may be similar at least in part to the communication device 310, 320, 330, and 340 of FIG. 3, or may include other embodiments of the communication device.

Referring to FIG. 4A and FIG. 4B, the communication device 400 (e.g., an antenna structure or a communication module) may include a substrate 410 (e.g., a dielectric material). According to an embodiment, the substrate 410 may include a first surface 4001 and a second surface 4002 facing away from the first surface 4001. According to an embodiment, the communication device 400 may be disposed inside the electronic device in such a manner that the first surface 4001 faces a rear plate (e.g., the rear plate 211 of FIG. 2B) of the electronic device.

According to various embodiments, the substrate 410 may be formed with a substantially rectangular shape. According to an embodiment, the substrate 410 may include a first side 411, a second side 412 extending from the first side 411 perpendicular to the first side 411, a third side 413 extending from the second side 412 perpendicular to the second side 412 and in parallel with the first side 411, and a fourth side 414 extending from the third side 413 perpendicular to the third side 413 and in parallel with the second side 412.

According to various embodiments, the communication device 400 may include at least one antenna array disposed on the first surface 4001 of the substrate 410. According to an embodiment, the at least one antenna array may include a patch type or pattern type conductive member formed on the first surface 4001 of the substrate 410. According to an embodiment, the antenna array may include a first antenna array 421 which forms a beam pattern to radiate toward the first side 411 of the substrate 410 (e.g., a direction ①), a second antenna array 422 which forms a beam pattern to radiate toward the second side 412 of the substrate 410 (e.g., a direction ②), and a third antenna array 423 which forms a beam pattern to radiate toward the rear plate (e.g., the rear plate 211 of FIG. 2B) of the electronic device (e.g., a direction ⑤). According to an embodiment, the first antenna array 421 and the second antenna array 422 may include a dipole antenna radiator formed on the first surface 4001 of the substrate 410 in a pattern type. However, without being limited thereto, the first antenna array 421 and the second antenna array 422 may be disposed on the second surface 4002 of the substrate 410 adjacent to the first side 411 and the second side 412 of the substrate 410, respectively, or may be disposed on a side surface between the first surface 4001 and the second surface 4002. According to an embodiment, the third antenna array 423 may include a patch type conductive member formed on the first surface 4001 of the substrate 410. According to an embodiment, the communication device 400 may include only the third antenna array 423, and for lateral radiation, may not include the first antenna array 421 and the second antenna array 422 disposed on the first side 411 and the second side 412, respectively.

According to various embodiments, the communication device 400 may include a communication circuit 430 (e.g., an RFIC) disposed on the second surface 4002 of the substrate 410. According to an embodiment, the antenna arrays 421, 422, and 423 may be electrically coupled with the communication circuit 430 through a conductive via penetrating from the first surface 4001 of the substrate 410 to the second surface 4002. However, without being limited thereto, the antenna arrays 421, 422, and 423 may be fed capacitively through coupling with the communication circuit 430. According to an embodiment, the communication device 400 may include a shield can 440 mounted on the first surface 4001 of the substrate 410 and then disposed to surround the communication circuit for noise shielding. According to an embodiment, the communication device 400 may include one or more terminals 450 and 460 to be electrically coupled with a PCB (e.g., the PCB 350 of FIG. 3) of the electronic device (e.g., the electronic device 300 of FIG. 3) through at least some regions of the substrate 410. According to an embodiment, the terminals 450 and 460 may include a power terminal 450 and/or an RF terminal 460 to be electrically coupled with the PCB of the electronic device through an electric connection member. According to an embodiment, the electric connection member may include a Flexible PCB (FPCB) 451 or a coaxial cable 461. According to an embodiment, although it is illustrated that the electric connection member is divided into two or more members, the electric connection members may be formed on a single FPCB altogether. According to an embodiment, a direction of pulling out the electric connection member may be a direction toward the left or right of the communication circuit 430 or a lower end (e.g., a lower end of the middle of the third antenna array 423). According to an embodiment, the one or more terminals 450 and 460 may be disposed on a region of the substrate spaced from a beam pattern direction depending on the antenna arrays 421, 422 and 423 among regions of the substrate 410. According to an embodiment, the one or more terminals 450 and 460 may be disposed on a region of the substrate 410 spaced from a beam pattern direction (e.g., a radiation direction) (a direction ①) of the first antenna array 421, a beam pattern direction (e.g., a radiation direction) (a direction ②) of the second antenna array 422, and a beam pattern direction (e.g., a radiation direction) (a direction ⑤) of the third antenna array 423. According to an embodiment, the one or more terminals 450 and 460 may be disposed on a first part P1 that is a region of the third side 413 of the substrate 410 spaced from the first side 411 and the second side 412, and/or a second part P2 that is a region of the fourth side 414 of the substrate 410 spaced from the first side 411 and the second side 412. According to an embodiment, the one or more terminals 450 and 460 may be disposed to be spaced by a designated interval from the first and second antenna arrays 421 and 422 on the third side 413 and/or the fourth side 414, rather than the first side 411 and the second side 412 on which the first antenna array 421 and the second antenna array 422 are disposed.

According to various embodiments, the communication device 400 may include at least one of a set 425 of a plurality of structures or a set 426 of a plurality of structures for decreasing impedance or noise caused by at least one signal processed in the communication device 400. In various embodiments, the impedance or the noise may imply a non-intended signal caused by signaling between components (e.g., at least one of the antenna arrays 421, 422, and 423, the communication circuit 430, etc.) in the communication device 400 for processing the at least one signal. In various embodiments, the impedance or the noise may imply a variable causing interference to the components in the communication device 400. In various embodiments, the set 425 of the plurality of structures may be exposed through at least part of the first surface 4001. In various embodiments, the set 426 of the plurality of structures may be exposed through at least part of the second surface 4002. The set 425 of the plurality of structures or the set 426 of the plurality of structures may be disposed across a plurality of layers included in the at least one substrate 410. The set 425 of the plurality of structures or the set 426 of the plurality of structures will be described below with reference to FIG. 5 to FIG. 11.

Figure 5:
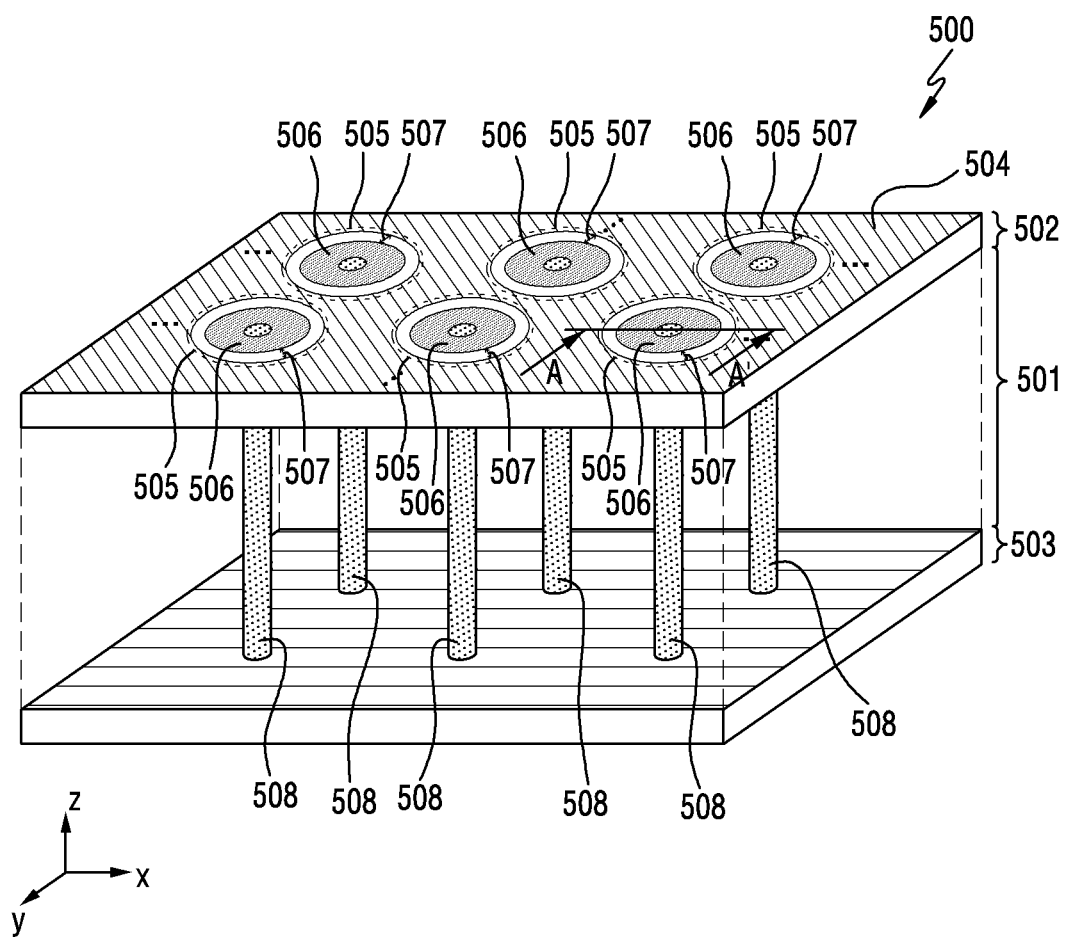
FIG. 5 illustrates an example of a Printed Circuit Board (PCB) including a plurality of structures according to various embodiments.

FIG. 5 illustrates an example of a PCB including a plurality of structures according to various embodiments.

Figure 6:
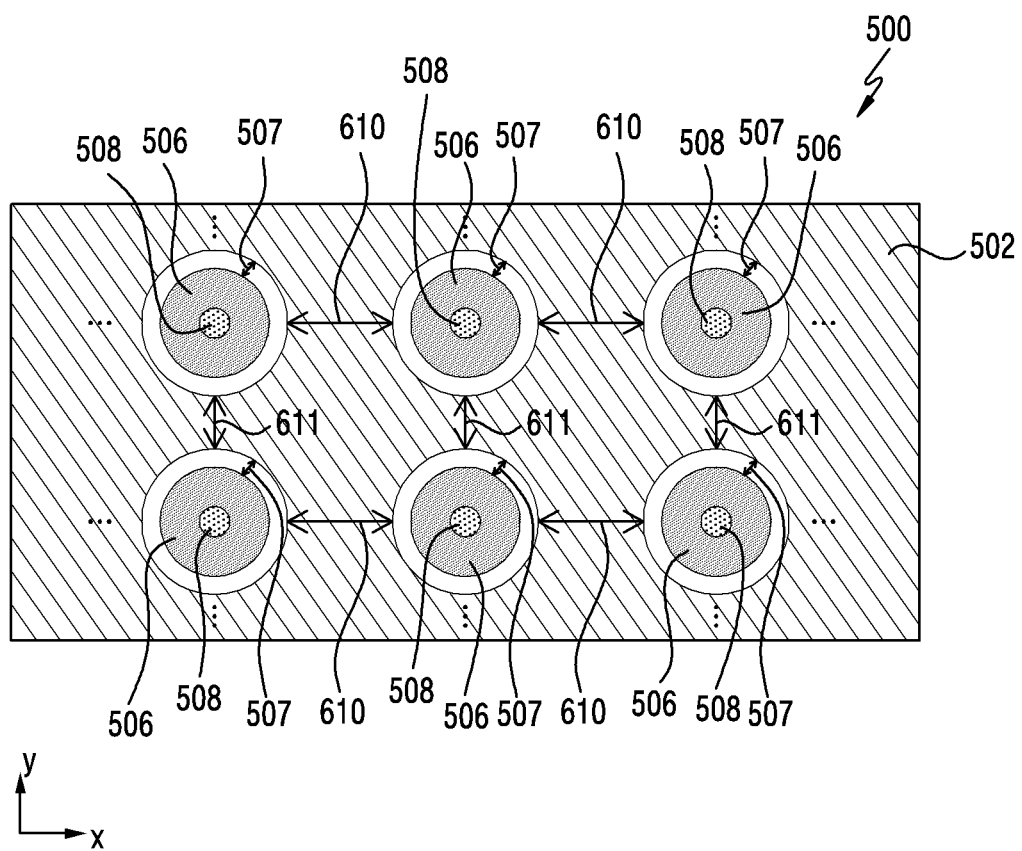
FIG. 6 is a plan view of a PCB including a plurality of structures of FIG. 5.

FIG. 6 is a plan view of a PCB including a plurality of structures of FIG. 5.

A PCB 500 according to an embodiment may be included in the electronic device 101 of FIG. 1, the electronic device 200 of FIG. 2A and FIG. 2B, the electronic device 300 of FIG. 3, or the communication device 400 of FIG. 4A and FIG. 4B. For example, the PCB 500 may be part of the substrate 410 of FIG. 4.

Referring to FIG. 5, the PCB 500 may include a plurality of layers. For example, the PCB 500 may include an insulating layer 501, a first conductive layer 502, and a second conductive layer 503.

The insulating layer 501 may imply a layer through which current does not flow when voltage less than breakdown voltage is applied. The insulating layer 501 may have larger resistivity, comparing to the first conductive layer 502 or the second conductive layer 503.

The first conductive layer 502 may imply a layer through which current flows when voltage having a designated range is applied. In various embodiments, the first conductive layer 502 may be disposed on (or under) the insulating layer 501. In various embodiments, the first conductive layer 502 may be in contact with a surface of the insulating layer 501. In various embodiments, the first conductive layer 502 may be positioned in parallel with the insulating layer 501.

In various embodiments, the first conductive layer 502 may include a ground area 504 and a plurality of openings 505 disposed within the ground area 504. In various embodiments, at least part of each of the plurality of openings 505 may include a space which can be filled with an insulating material. In various embodiments, at least part of each of the plurality of openings 505 may include a space having a feature different from that of the ground area 504. In various embodiments, each of the plurality of openings 505 may be disposed in the first conductive layer 502 to electrically separate a plurality of via pads 506 from the ground area 504.

Although a case where the plurality of openings 505 are configured with a circular shape is exemplified in FIG. 5, this is for convenience of explanations. For example, each of the plurality of openings 505 may be formed with a circular shape having a plurality of grooves. For another example, each of the plurality of openings 505 may be formed with a rectangular shape or a triangular shape. For another example, the plurality of openings 505 may have different shapes from each other. However, the disclosure is not limited thereto.

In various embodiments, the plurality of openings 505 may be arranged according to a designated rule. In various embodiments, the plurality of openings 505 may be configured with at least one array. For example, referring to FIG. 6, the first conductive layer 502 may include the plurality of openings 505 spaced by a distance 610 in an x-axis direction. For another example, referring to FIG. 6, the first conductive layer 502 may include the plurality of openings 505 spaced by a distance 611 in a y-axis direction. According to embodiments, the distance 610 and the distance 611 may be equal to each other or different from each other. However, the disclosure is not limited thereto.

The second conductive layer 503 may imply a layer through which current flows when voltage having a designated range is applied. In various embodiments, the second conductive layer 503 may be disposed under (or on) the insulating layer 501. In various embodiments, the second conductive layer 503 may be in contact with another surface differentiated from a surface of the insulating layer 501 in contact with the first conductive layer 502. In various embodiments, the second conductive layer 503 may be positioned in parallel with the insulating layer 501.

In various embodiments, the second conductive layer 503 may be configured to apply designated voltage. For example, the second conductive layer 503 may include a power area. In various embodiments, the second conductive layer 503 may include the power area to provide power to at least one chip (or circuitry, integrated circuit) included in the PCB 500. For example, the second conductive layer 503 may be referred to as a power layer. In various embodiments, the second conductive layer 503 may include the power area for a signal transmitted or received between the at least one chip or a signal transmitted or received between the at least one chip and at least another chip in another PCB differentiated from the PCB 500. For example, the second conductive layer 503 may be referred to as a signal layer. In various embodiments, the second conductive layer 503 may be used for a ground. When the second conductive layer 503 is configured for the ground, current or voltage may not be applied to the second conductive layer 503.

In various embodiments, the PCB 500 may further include the plurality of conductive via pads 506 disposed respectively within the plurality of openings 505 included in the first conductive layer 502. In order to be electrically separated from the first conductive layer 502, the plurality of conductive via pads 506 may be disposed respectively within the plurality of openings 505 and may be spaced from the first conductive layer 502. For example, referring to FIG. 6, when the first conductive layer 502 is seen from above, the plurality of openings 505 included in the first conductive layer 502 may respectively include the plurality of conductive via pads 506 and a plurality of clearances 507 respectively surrounding the plurality of via pads 506. The plurality of clearances 507 may imply intervals between the respective plurality of conductive via pads 506 and the ground area 504. The plurality of clearances 507 may be configured to electrically separate the respective plurality of conductive via pads 506 from the first conductive layer 502. According to an embodiment, each of the plurality of clearances 507 may be filled with an insulating material. In various embodiments, each of the plurality of clearances 507 may be referred to as an insulating gap.

In various embodiments, each of the plurality of conductive via pads 506 may have various shapes. For example, the plurality of conductive via pads 506 may be configured with shapes corresponding to shapes of the respective plurality of openings 505. For another example, the plurality of conductive via pads 506 may be configured with shapes corresponding to shapes of a respective plurality of conductive vias 508 described below. However, the disclosure is not limited thereto.

In various embodiments, the PCB 500 may further include the plurality of conductive vias 508 configured to electrically couple the respective plurality of conductive via pads 506 and the second conductive layer 503. The plurality of conductive vias 508 may physically or electrically couple the respective plurality of conductive via pads 506 to the second conductive layer 503 so that voltage applied to the second conductive layer is provided to the plurality of conductive via pads 506. Each of the plurality of conductive vias 508 may be disposed or included in the insulating layer 501.

In various embodiments, each of the plurality of conductive via pads 506, each of the plurality of clearances 507, each of the plurality of conductive vias 508, and the second conductive layer 503 may configure a structure (e.g., a structure 700 of FIG. 7) for decreasing magneto-impedance caused by cavity resonance between a power area (e.g., a power area included in the second conductive layer 503) related to the PCB 500 and a ground area (e.g., a ground area included in the first conductive layer 502) related to the PCB 500 and an S-parameter between the power area and the ground area. For example, each of the plurality of conductive via pads 506, each of the plurality of clearances 507, each of the plurality of conductive vias 508, and the second conductive layer 503 may configure the structure (e.g., the structure 700 of FIG. 7) for decreasing noise caused in signal processing on a mmWave band. For example, referring to FIG. 7, the structure 700 may include at least part of each of the plurality of conductive via pads 506, each of the plurality of clearances 507, each of the plurality of conductive vias 508, and the second conductive layer 503.

The second conductive layer 503 may be configured to apply voltage. The voltage applied to the second conductive layer 503 may be provided to each of the plurality of via pads 506 through the respective plurality of vias 508. For example, an electric potential of the second conductive layer 503 may be 'a' volt (V), an electric potential of each of the plurality of conductive vias 508 may be 'b' V, an electric potential of each of the plurality of conductive via pads 506 may be 'c' V, and an electric potential of the ground area 504 may be 0 V. Due to theses electrical potentials, each of the plurality of conductive via pads 506 may serve to form a capacitance element (component), and each of the plurality of vias 508 may serve to form an inductance element. Due to the forming of these elements, mutual capacitance may be formed between the plurality of via pads 506. These elements may serve to form characteristic impedance having a magnitude greater than or equal to a designated value on a designated frequency band in a direction in which an electromagnetic wave caused between the power area and the ground area passes. The characteristic impedance may hinder or prevent the electromagnetic wave from passing in the form of a Transverse ElectroMagnetic (TEM) mode. In various embodiments, the characteristic impedance may decrease transfer impedance or input impedance between the power area (e.g., the second conductive layer 503) and the ground area (e.g., the first conductive layer 502). For another example, when the second conductive layer 503 is configured for a ground, an electric potential of the second conductive layer 503, an electric potential of each of the plurality of conductive vias 508, and an electric potential of each of the plurality of conductive via pads 506 may be 0. Due to these electric potentials, a plurality of structures configured with the second conductive layer 503, the plurality of conductive vias 508, and the plurality of conductive via pads 506 may operate as a filter.

In various embodiments, a size (or area) of each of the plurality of conductive via pads 506 may be changed depending on a targeted magnitude of the characteristic impedance. In various embodiments, a spacing (e.g., the spacing 610 and the spacing 611) between the plurality of conductive via pads 506 may be changed depending on the targeted magnitude of the characteristic impedance. In various embodiments, the size of each of the plurality of conductive vias 508 may be changed depending on the targeted magnitude of the characteristic impedance. In various embodiments, a spacing between the plurality of conductive vias 508 may be changed depending on the targeted magnitude of the characteristic impedance. In various embodiments, a size of the plurality of clearances 507 may be changed depending on the targeted magnitude of the characteristic impedance.

As described above, the PCB 500 according to various embodiments may include a plurality of structures such as the structure 700. In various embodiments, the plurality of structures may be designed in the PCB 500 to decrease noise caused by signal processing on a mmWave band. In various embodiments, the plurality of structures disposed in the PCB 500 may overcome the limitation of a decoupling capacitor that can be used only on a limited frequency band (e.g., a frequency band less than or equal to 1 GHz). In various embodiments, the plurality of structures disposed in the PCB 500 may decrease the noise caused by signaling processing on the mmWave band, unlike a ground via for providing a connection between the ground areas to decrease impedance between the ground areas.

Figure 7:
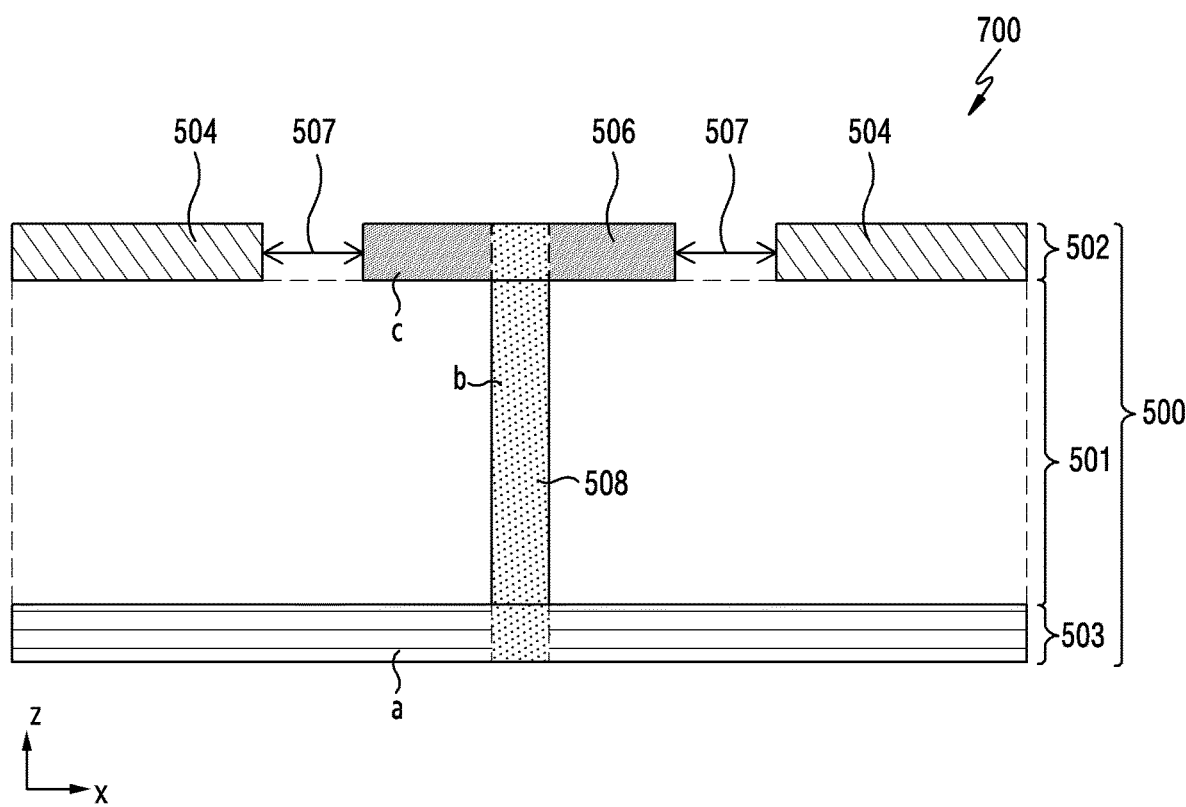
FIG. 7 is a cross-sectional view of a structure included in a PCB, seen along the line A-A'.

Although it is illustrated in FIG. 5 to FIG. 7 that the plurality of conductive vias 508 are exposed through at least part of the respective plurality of conductive via pads 506, according to embodiments, the plurality of conductive vias 508 may not be exposed through at least part of the respective plurality of conductive via pads 506.

Figure 8:
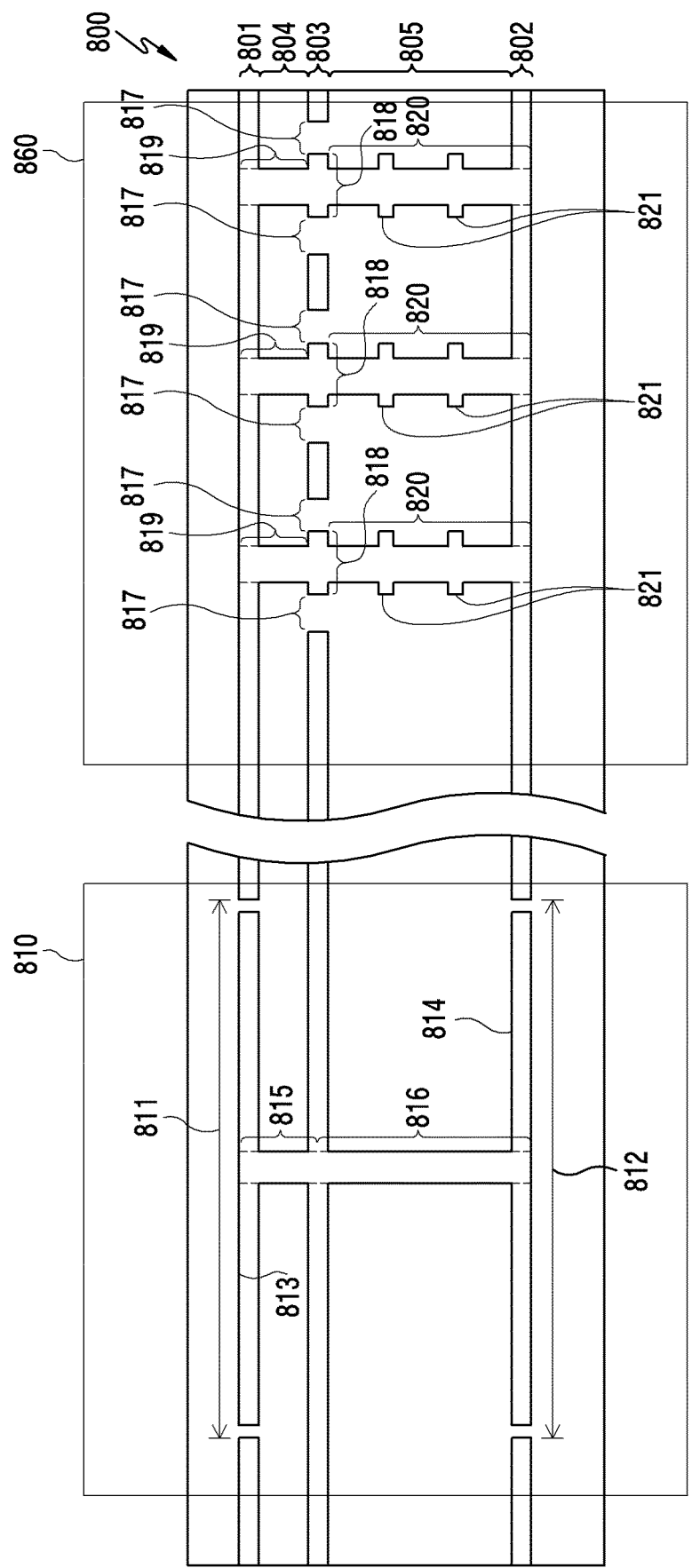
FIG. 8 illustrates another example of a PCB including a structure according to various embodiments.

FIG. 8 illustrates another example of a PCB including a structure according to various embodiments. A PCB 800 according to an embodiment may be included in the electronic device 101 of FIG. 1, the electronic device 200 of FIG. 2A and FIG. 2B, the electronic device 300 of FIG. 3, or the communication device 400 of FIG. 4A and FIG. 4B.

Referring to FIG. 8, the PCB 800 may include a plurality of layers. For example, the PCB 800 may include a first conductive layer 801 including a ground area, a second conductive layer 802 positioned in parallel with the first conductive layer 801 and including a ground area, a third conductive layer 803 positioned in parallel with the first conductive layer 801 and interposed between the first conductive layer 801 and the second conductive layer 802, a first insulating layer 804 interposed between the first conductive layer 801 and the third conductive layer 803, and a second insulating layer 805 interposed between the second conductive layer 802 and the third conductive layer 803. In various embodiments, at least part of the first conductive layer 801 and the second conductive layer 802 may include a ground area. In various embodiments, at least part of the third conductive layer 803 may include a power area.

In various embodiments, the PCB 800 may include a first structure 810 for removing noise by using characteristic impedance and a second structure 860 for decreasing impedance between ground areas included in the PCB 800.

In various embodiments, the first conductive layer 801 in the first structure 810 may include a first opening 811. The second conductive layer 802 in the first structure 810 may include a second opening 812 overlapping in part with the first opening 811 when the first conductive layer 801 is seen from above. The first structure 810 may include a first conductive plate 813 electrically separated from the first conductive layer 801 and disposed in the first opening 811. The first conductive plate 813 may be referred to as a conductive via pad. The first structure 810 may include a second conductive plate 814 electrically separated from the second conductive layer 802 and disposed in the second opening 812. The second conductive plate 814 may be referred to as a conductive via pad. The first structure 810 may include a first conductive via 815 electrically coupled between the first conductive plate 813 and the third conductive layer 803 through the first insulating layer 804. At least part of the first conductive via 815 (e.g., an end of the first conductive via 815) may be inserted to the first conductive plate 813 to electrically couple the first conductive plate 813 and the third conductive layer 803. At least another part of the first conductive via 815 (e.g., another end of the first conductive via 815) may be inserted to the third conductive layer 803 to electrically couple the first conductive plate 813 and the third conductive layer 803. The first structure 810 may include a second conductive via 816 electrically coupled between the second conductive plate 814 and the third conductive layer 803 through the second insulating layer 805. At least part of the second conductive via 816 (e.g., an end of the second conductive via 816) may be inserted to the second conductive plate 814 to electrically couple the second conductive plate 814 and the third conductive layer 803. At least another part of the second conductive via 816 (e.g., another end of the second conductive via 816) may be inserted to the third conductive layer 803 to electrically couple the second conductive plate 814 and the third conductive layer 803. According to embodiments, the first conductive via 815 and the second conductive via 816 may be configured with one conductive via.

In various embodiments, since the first conductive plate 813, the first conductive via 815, the second conductive plate 814, and the second conductive via 816 are electrically coupled with the third conductive layer 803 including the power area, voltage applied to the third conductive layer 803 may be applied to the first conductive plate 813, the first conductive via 815, the second conductive plate 814, and the second conductive via 816, unlike the first conductive layer 801 and second conductive layer 802 including the ground area. The applying of the voltage to the first conductive plate 813, the first conductive via 815, the second conductive plate 814, and the second conductive via 816 may serve to form characteristic impedance in the first structure 810.

In various embodiments, the third conductive layer 803 in the second structure 860 may include a plurality of openings 817. The plurality of openings 817 may electrically separate a plurality of conductive via pads 818 from voltage applied to the third conductive layer 803. In various embodiments, a width of the plurality of conductive via pads 818 in the second structure 860 may be narrower than a width of the first conductive plate 813 in the first structure 810. In various embodiments, the width of the plurality of conductive via pads 818 in the second structure 860 may be narrower than a width of the second conductive plate 814 in the first structure 810. In various embodiments, the second structure 860 may include a plurality of conductive vias 819 electrically coupled between the first conductive layer 801 and the respective plurality of conductive via pads 818 through the first insulating layer 804. At least part of each of the plurality of third conductive vias 819 may be inserted to the first conductive layer 801 to electrically couple the first conductive layer 801 and the respective plurality of conductive via pads 818, and at least another part of each of the plurality of third conductive vias 819 may be inserted to the respective plurality of conductive via pads 818 to electrically couple the first conductive layer 801 and the respective plurality of conductive via pads 818. Since the first conductive layer 801 includes a ground area, voltage of the first conductive layer 801, each of the plurality of conductive via pads 818, and each of the plurality of third conductive vias 819 may correspond to 0 V in the second structure 860. The second structure 860 may include a plurality of fourth conductive vias 820 electrically coupled between the second conductive layer 802 and the respective plurality of conductive via pads 818 through the second insulating layer 805. At least part of each of the plurality of fourth conductive vias 820 may be inserted to the second conductive layer 802 to electrically couple the second conductive layer 802 and the respective plurality of conductive via pads 818, and at least another part of each of the plurality of fourth conductive vias 820 may be inserted to the respective plurality of conductive via pads 818 to electrically couple the second conductive layer 802 and the respective plurality of conductive via pads 818. The third conductive layer 803 includes the ground area, and voltage of each of the plurality of conductive via pads 818 is 0 V as described above. Therefore, voltage of each of the second conductive layer 802 and each of the plurality of fourth conductive vias 820 may correspond to 0 V in the second structure 860. The second structure 860 may further include a plurality of conductive via pads 821 to fix the respective plurality of third conductive vias 819 and the respective plurality of fourth conductive vias 820.

Although an example in which the PCB 800 includes the first structure 810 and the second structure 860 is illustrated in FIG. 8, this is for convenience of explanations. According to embodiments, it should be noted that the PCB 800 may include only the first structure 810, or may include only the second structure 860.

As described above, the first structure 810 according to various embodiments may include a clearance in a layer (e.g., the first conductive layer 801, the second conductive layer 802) including a ground area, unlike the second structure 860 including a clearance in a layer (e.g., the second conductive layer 803) including a power area. The first structure 810 according to various embodiments may include the first conductive plate 813, second conductive plate 814, first conductive via 815, and second conductive via 816 having voltage (e.g., voltage having a positive real value) different from 0 V, unlike the second structure 860 including the plurality of conductive via pads 818, third conductive vias 819, and fourth conductive vias 820 having voltage of 0 V. Due to such a structural difference between the first structure 810 and the second structure 860, the second structure 860 may decrease impedance between the ground areas, whereas the first structure 810 may block coupling caused by cavity resonance which occurs between the power area and the ground area.

Figure 9:
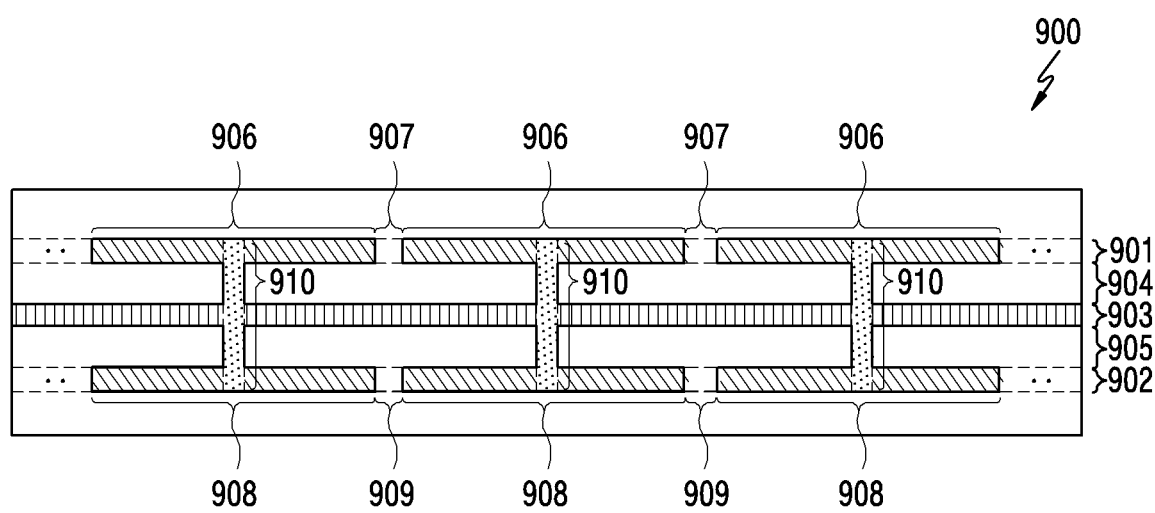
FIG. 9 illustrates another example of a PCB including a plurality of structures according to various embodiments.

FIG. 9 illustrates another example of a PCB including a plurality of structures according to various embodiments. A PCB 900 according to an embodiment may be included in the electronic device 101 of FIG. 1, the electronic device 200 of FIG. 2A and FIG. 2B, the electronic device 300 of FIG. 3, or the communication device 400 of FIG. 4A and FIG. 4B.

Referring to FIG. 9, the PCB 900 may include a first conductive layer 901, a second conductive layer 902 positioned in parallel with the first conductive layer 901, a third conductive layer 903 positioned in parallel with the first conductive layer 901 and interposed between the first conductive layer 901 and the second conductive layer 902, a first insulating layer 904 interposed between the first conductive layer 901 and the third conductive layer 903, and a second insulating layer 905 interposed between the second conductive layer 902 and the third conductive layer 903. In various embodiments, each of the first conductive layer 901 and the second conductive layer 902 may include a ground area, and the third conductive layer 903 may include a power area. For example, each of the first conductive layer 901 and the second conductive layer 902 may correspond to a ground layer, and the third conductive layer 903 may correspond to a power layer.

The first conductive layer 901 in the PCB 900 may include a plurality of conductive via pads 906 and a plurality of clearances 907 disposed between the plurality of conductive via pads 906. The second conductive layer 902 in the PCB 900 may include a plurality of conductive via pads 908 and a plurality of clearances 909 disposed between the plurality of conductive via pads 908. The PCB 900 may include a plurality of vias 910 which respectively couple the plurality of via pads 906 and the third conductive layer 903 through the first insulating layer 904 and respectively couple the plurality of via pads 908 and the third conductive layer 903 through the second insulating layer 905. In the PCB 900, each of the plurality of via pads 906, each of the plurality of via pads 908, and each of the plurality of vias 910 may have voltage (e.g., voltage having a positive real value) different from 0 V due to voltage applied to the third conductive layer 903. For example, since each of the plurality of via pads 906, each of the plurality of via pads 908, and each of the plurality of vias 910 have voltage different from 0 V, characteristic impedance may be formed. The characteristic impedance may block coupling between a power area (e.g., the third conductive layer 903) and a ground area (e.g., the first conductive layer 901 or the second conductive layer 902). For example, as shown in FIG. 9, when a plurality of structures including the plurality of via pads 908 having the same size along the plurality of ground areas and power areas are arranged therein, a set of the plurality of structures may prevent coupling caused between the power area and the ground area on a first frequency band having a first designated range. In various embodiments, the set of the plurality of structures may change a frequency band for preventing the coupling between the power area and the ground area by changing at least one of a size of each of the plurality of conductive via pads 906 respectively included in the plurality of structures, a spacing between the plurality of conductive via pads 906, a size of each of the plurality of conductive via pads 908, a spacing between the plurality of conductive via pads 908, a size of each of the plurality of conductive vias 910, and a spacing between the plurality of conductive vias 910. For example, the set of the plurality of structures may prevent noise from being inserted or included in a signal on the first frequency band having the first designated range.

Figure 10:
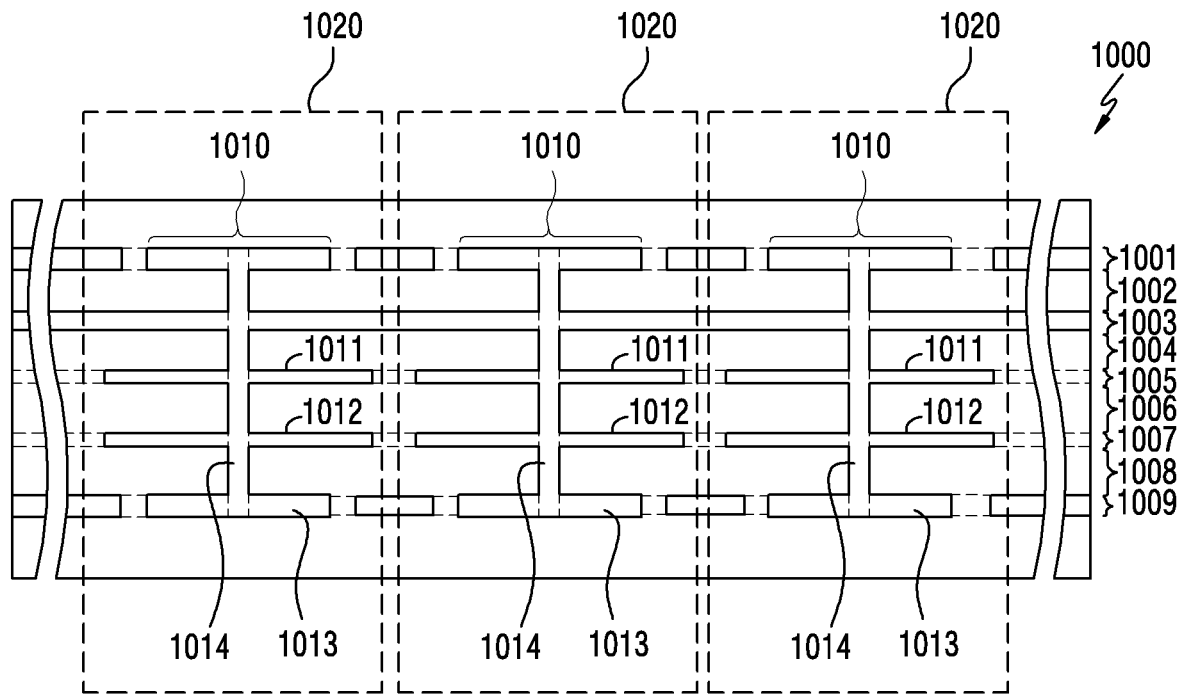
FIG. 10 illustrates another example of a PCB including a plurality of structures according to various embodiments.

FIG. 10 illustrates another example of a PCB including a plurality of structures according to various embodiments. A PCB 1000 according to an embodiment may be included in the electronic device 101 of FIG. 1, the electronic device 200 of FIG. 2A and FIG. 2B, the electronic device 300 of FIG. 3, or the communication device 400 of FIG. 4A and FIG. 4B.

Referring to FIG. 10, the PCB 1000 may include a plurality of layers. For example, the PCB 1000 may include a first insulating layer 1001, a second insulating layer 1002 positioned in parallel with the first conductive layer 1001 and in contact with a surface of the first conductive layer 1001, a second conductive layer 1003 positioned in parallel with the first insulating layer 1002 and in contact with a surface of the first insulating layer 1002, a second insulating layer 1004 positioned in parallel with the second conductive layer 1003 and in contact with a surface of the second conductive layer 1003, a third conductive layer 1005 positioned in parallel with the second insulating layer 1004 and in contact with a surface of the second insulating layer 1004, a third insulating layer 1006 positioned in parallel with the third conductive layer 1005 and in contact with a surface of the third conductive layer 1005, a fourth conductive layer 1007 positioned in parallel with the third insulating layer 1006 and in contact with a surface of the third insulating layer 1006, a fourth insulating layer 1008 positioned in parallel with the fourth conductive layer 1007 and in contact with a surface of the fourth conductive layer 1007, and a fifth conductive layer 1009 positioned in parallel with the fourth insulating layer 1008 and in contact with a surface of the fourth insulating layer 1008. In various embodiments, each of the first conductive layer 1001 and the fifth conductive layer 1009 may include a ground area, the second conductive layer 1003 may include a power area, and each of the third conductive layer 1005 and the fourth conductive layer 1007 may include a power area. In various embodiments, the second conductive layer 1003 may be configured so that voltage is applied to provide power to at least one component (e.g., a chip, a circuit, etc.) in the PCB 1000, and each of the third conductive layer 1005 and the fourth conductive layer 1007 may be configured such that voltage is applied to exchange a signal between at least one component in the PCB 100 or to exchange a signal between at least another component in another PCB differentiated from the PCB 1000.

In various embodiments, a plurality of structures 1020 in the PCB 1000 may respectively include a plurality of conductive via pads 1010 included in the first conductive layer 1001. In various embodiments, the plurality of structures 1020 in the PCB 1000 may respectively include a plurality of conductive via pads 1011 included in the third conductive layer 1005. In various embodiments, the plurality of structures 1020 in the PCB 1000 may respectively include a plurality of via pads 1012 included in the fourth conductive layer 1007. In various embodiments, the plurality of structures 1020 in the PCB 1000 may respectively include a plurality of via pads 1013 included in the fifth conductive layer 1009.

In various embodiments, the plurality of structures 1020 in the PCB 1000 may respectively include a plurality of conductive vias 1014 for electrically coupling the plurality of conductive via pads 1010, the plurality of conductive via pads 1011, the plurality of conductive via pads 1012, and the plurality of conductive via pads 1013, respectively. Voltage applied from at least one of the second conductive layer 1003, each of the plurality of conductive via pads 1011, and each of the plurality of conductive via pads 1012 may be applied to each of the plurality of conductive via pads 1010, each of the plurality of conductive via pads 1011, each of the plurality of conductive via pads 1012, and each of the plurality of conductive via pads 1013 through the respective plurality of conductive vias 1014. Due to the applying of this voltage, a capacitance element may be formed in each of the plurality of conductive via pads 1010, each of the plurality of via pads 1011, each of the plurality of via pads 1012, and each of the plurality of conductive via pads 1013, and an inductance element may be formed in the plurality of conductive vias 1014. The forming of these elements may cause characteristic impedance. The characteristic impedance may block coupling between a power area (e.g., the second conductive layer 1002) and a ground area (e.g., the first conductive layer 1001 or the fifth conductive layer 1009). For example, when the plurality of structures 1020 which are symmetric are disposed in the PCB 1000, a set of the plurality of structures 1020 may prevent coupling caused between the power area and the ground area on a second frequency band having a second designated range wider than the first designated range. In various embodiments, the set of the plurality of structures 1020 may change a frequency band for preventing the coupling between the power area and the ground area from the first frequency band to the second frequency band, by changing at least one of a size of each of the plurality of conductive via pads 1010 respectively included in the plurality of structures 1020, a spacing between the plurality of conductive via pads 1010, a size of each of the plurality of conductive via pads 1011, a spacing between the plurality of conductive via pads 1011, a size of each of the plurality of conductive via pads 1012, a spacing between the plurality of conductive via pads 1012, a size of each of the plurality of conductive via pads 1013, a spacing between the plurality of conductive via pads 1013, a size of each of the plurality of conductive vias 1014, and a spacing between the plurality of conductive vias 1014. For example, the set of the plurality of structures 1020 may prevent noise from being inserted or included in a signal on the second frequency band having the second designated range.

Figure 11:
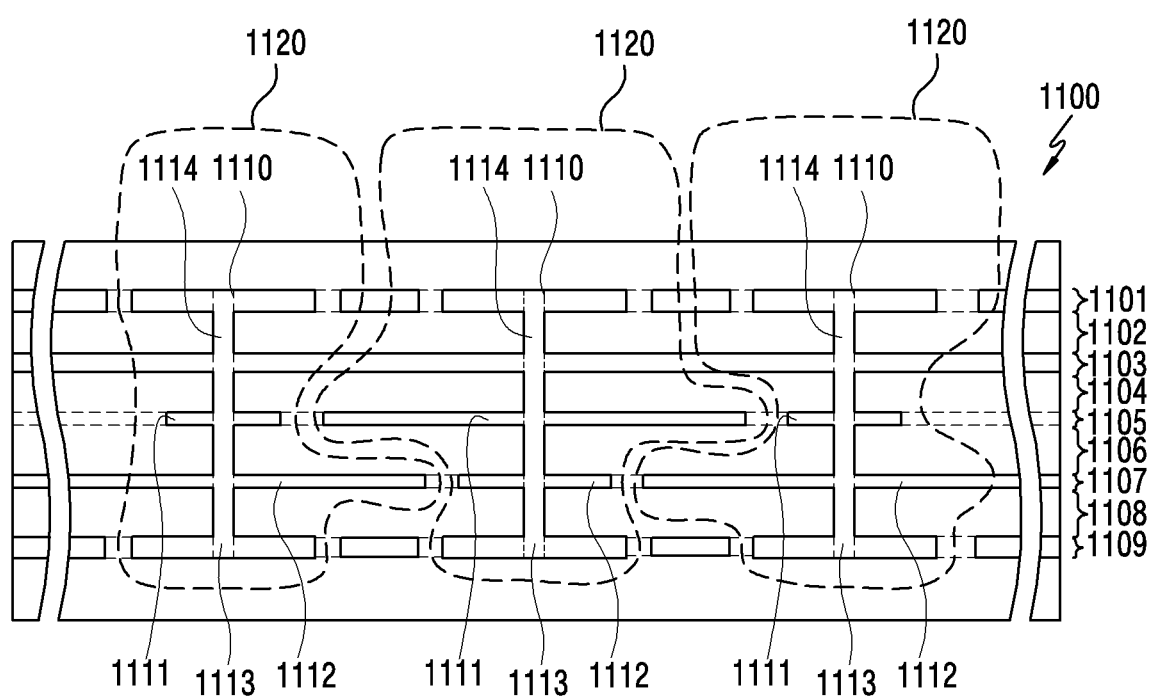
FIG. 11 illustrates another example of a PCB including a plurality of structures according to various embodiments.

FIG. 11 illustrates another example of a PCB including a plurality of structures according to various embodiments. A PCB 1100 according to an embodiment may be included in the electronic device 101 of FIG. 1, the electronic device 200 of FIG. 2A and FIG. 2B, the electronic device 300 of FIG. 3, or the communication device 400 of FIG. 4A and FIG. 4B.

Referring to FIG. 11, the PCB 1100 may include a plurality of layers. For example, the PCB 1100 may include a first insulating layer 1101, a second insulating layer 1102 positioned in parallel with the first conductive layer 1101 and in contact with a surface of the first conductive layer 1101, a second conductive layer 1103 positioned in parallel with the first insulating layer 1102 and in contact with a surface of the first insulating layer 1102, a second insulating layer 1104 positioned in parallel with the second conductive layer 1103 and in contact with a surface of the second conductive layer 1103, a third conductive layer 1105 positioned in parallel with the second insulating layer 1104 and in contact with a surface of the second insulating layer 1104, a third insulating layer 1106 positioned in parallel with the third conductive layer 1105 and in contact with a surface of the third conductive layer 1105, a fourth conductive layer 1107 positioned in parallel with the third insulating layer 1106 and in contact with a surface of the third insulating layer 1106, a fourth insulating layer 1108 positioned in parallel with the fourth conductive layer 1107 and in contact with a surface of the fourth conductive layer 1107, and a fifth conductive layer 1109 positioned in parallel with the fourth insulating layer 1108 and in contact with a surface of the fourth insulating layer 1108. In various embodiments, each of the first conductive layer 1101 and the fifth conductive layer 1109 may include a ground area, the second conductive layer 1103 may include a power area, and each of the third conductive layer 1105 and the fourth conductive layer 1107 may include a power area. In various embodiments, the second conductive layer 1103 may be configured so that voltage is applied to provide power to at least one component (e.g., a chip, a circuit, etc.) in the PCB 1100, and each of the third conductive layer 1105 and the fourth conductive layer 1107 may be configured such that voltage is applied to exchange a signal between at least one component in the PCB 110 or to exchange a signal between at least another component in another PCB differentiated from the PCB 1100.

In various embodiments, a plurality of structures 1120 in the PCB 1100 may respectively include a plurality of conductive via pads 1110 included in the first conductive layer 1101. In various embodiments, the plurality of structures 1120 in the PCB 1100 may respectively include a plurality of conductive via pads 1111 included in the third conductive layer 1105. In various embodiments, the plurality of structures 1120 in the PCB 1100 may respectively include a plurality of via pads 1112 included in the fourth conductive layer 1107. In various embodiments, the plurality of structures 1120 in the PCB 1100 may respectively include a plurality of via pads 1113 included in the fifth conductive layer 1109.

In various embodiments, the plurality of structures 1120 in the PCB 1100 may respectively include a plurality of conductive vias 1114 for electrically coupling the plurality of conductive via pads 1110, the plurality of conductive via pads 1111, the plurality of conductive via pads 1112, and the plurality of conductive via pads 1113, respectively. Voltage applied from at least one of the second conductive layer 1103, each of the plurality of conductive via pads 1111, and each of the plurality of conductive via pads 1112 may be applied to each of the plurality of conductive via pads 1110, each of the plurality of conductive via pads 1111, each of the plurality of conductive via pads 1112, and each of the plurality of conductive via pads 1113 through the respective plurality of conductive vias 1114. Due to the applying of this voltage, a capacitance element may be formed in each of the plurality of conductive via pads 1110, each of the plurality of via pads 1111, each of the plurality of via pads 1112, and each of the plurality of conductive via pads 1113, and an inductance element may be formed in the plurality of conductive vias 1114. The forming of these elements may cause characteristic impedance. The characteristic impedance may block coupling between a power area (e.g., the second conductive layer 1102) and a ground area (e.g., the first conductive layer 1101 or the fifth conductive layer 1109). For example, when the plurality of structures 1120 which are asymmetric are disposed in the PCB 1100, a set of the plurality of structures may prevent coupling caused between the power area and the ground area on a third frequency band having a third designated range different at least in part from the first designated range and a fourth frequency band having a fourth designated range different from the second designated range. In various embodiments, the set of the plurality of structures 1120 may separate a frequency band for preventing the coupling between the power area and the ground area into two or more frequency bands, by changing at least one of a size of each of the plurality of conductive via pads 1110 respectively included in the plurality of structures 1120, a spacing between the plurality of conductive via pads 1110, a size of each of the plurality of conductive via pads 1111, a spacing between the plurality of conductive via pads 1111, a size of each of the plurality of conductive via pads 1112, a spacing between the plurality of conductive via pads 1112, a size of each of the plurality of conductive via pads 1113, a spacing between the plurality of conductive via pads 1113, a size of each of the plurality of conductive vias 1114, a spacing between the plurality of conductive vias 1114, and a shape of each of the plurality of structures. For example, the set of the plurality of structures 1120 may prevent noise from being inserted or included in a signal on the third frequency band and a signal on the fourth frequency band. For example, the set of the plurality of structures may prevent noise from occurring in the PCB 1100 in a procedure of processing signals related to a dual connection.

An electronic device (e.g., the electronic device 101 of FIG. 1) according to various embodiments described above may include a housing (e.g., the housing 210 of FIG. 2), an antenna structure (e.g., the communication device 400 of FIG. 4A and FIG. 4B) positioned in the housing, and a wireless communication circuit (e.g., the RFICs 310, 320, 330, and 340, IFIC 360, CP 370, communication circuit 390, or the like of FIG. 3). The antenna structure may include a first conductive layer (e.g., the first conductive layer 801 of FIG. 8) including a first opening (e.g., the first opening 811 of FIG. 8), a second conductive layer (e.g., the second conductive layer 802 of FIG. 8) positioned in parallel with the first conductive layer, and including a second opening (e.g., the second opening 812 of FIG. 8) which overlaps at least in part with the first opening when the first conductive layer is seen from above, a third conductive layer (e.g., the third conductive layer 803 of FIG. 8) positioned in parallel with the first conductive layer and interposed between the first conductive layer and the second conductive layer, a first insulating layer (e.g., the first insulating layer 804 of FIG. 8) interposed between the first conductive layer and the third conductive layer, a second insulating layer (e.g., the second insulating layer 805 of FIG. 8) interposed between the second conductive layer and the third conductive layer, a first conductive plate (e.g., the first conductive plate 813 of FIG. 8) electrically separated from the first conductive layer and disposed within the first opening, a second conductive plate (e.g., the second conductive plate 814 of FIG. 8) electrically separated from the second conductive layer and disposed within the second opening, a first conductive via (e.g., the first conductive via 815 of FIG. 8) electrically coupled between the first conductive plate and the third conductive layer through the first insulating layer, and a second conductive via (e.g., the second conductive via 816 of FIG. 8) electrically coupled between the second conductive plate and the third conductive layer through the second insulating layer. The wireless communication circuit may be configured to transmit or receive a signal having a frequency between 3 Giga Hertz (GHz) and 100 GHz and is electrically coupled to the antenna structure.

In various embodiments, the first conductive plate and the second conductive plate may serve to form a capacitive element. In various embodiments, at least one of the first conductive via and the second conductive via may serve to form an inductive element.

In various embodiments, the antenna structure may further include a first conductive line formed in or on the third conductive layer. In various embodiments, the first conductive layer and the second conductive layer may serve to form a ground area. In various embodiments, the antenna structure may further include a second conductive line formed in or on the first conductive layer. The second conductive liner may be electrically coupled with the wireless communication circuit. In various embodiments, the second conductive layer may serve to form a ground area.

A Printed Circuit Board (PCB) (e.g., the PCB 500 of FIG. 5) described above may include an insulating layer (e.g., the insulating layer 501 of FIG. 5), a first conductive layer (e.g., the first conductive layer 502 of FIG. 5) disposed on the insulating layer and including a ground area (e.g., the ground area 504 of FIG. 5) and an opening (e.g., the opening 505 of FIG. 5) disposed within the ground area, a second conductive layer (e.g., the second conductive layer 503 of FIG. 5) disposed under the insulating layer and configured to apply voltage, a conductive via pad (e.g., the conductive via pad 506 of FIG. 5) disposed within the opening and spaced from the ground area, and a conductive via (e.g., the conductive via 508 of FIG. 5) disposed in the insulating layer, and configured to electrically couple the conductive via pad and the second conductive layer. The conductive via pad may be electrically separated from the ground area.

In various embodiments, the first conductive layer, the second conductive layer, and the insulating layer may be positioned in parallel with each other.

In various embodiments, a distance between the conductive via pad and the second conductive layer may correspond to a distance between the first conductive layer and the second conductive layer.

In various embodiments, the voltage may be applied to the conductive via and the conductive via pad. In various embodiments, the conductive via pad to which the voltage may be applied and the ground area serve to form a capacitive element. In various embodiments, the PCB may further include a first chip. The capacitive element may be used to decrease noise included in a signal transmitted from the first chip to a second chip differentiated from the first chip. For example, the signal may be related to a mmWave band.

In various embodiments, a shape of the opening may correspond to a shape of the conductive via pad.

An antenna structure (e.g., the communication device 400 of FIG. 4A and FIG. 4B) according to various embodiments described above may include at least one circuitry related to wireless communication and a PCB (e.g., the substrate 410 of FIG. 4) operatively coupled with the at least one circuitry. The PCB may include an insulating layer (e.g., the insulating layer 501 of FIG. 5), a first conductive layer (e.g., the first conductive layer 502 of FIG. 5) in contact with a surface of the insulating layer and including a ground area (e.g., the ground area 504 of FIG. 5) and a plurality of openings (e.g., the plurality of openings 505 of FIG. 5) disposed within the ground area, a second conductive layer (e.g., the second conductive layer 503) in contact with another surface of the insulating layer and configured to apply voltage, a plurality of conductive pads (e.g., the plurality of via pads 506) disposed respectively within the plurality of openings and spaced from the ground area, and a plurality of conductive vias (e.g., the plurality of conductive vias 508 of FIG. 5) disposed in the insulating layer and configured to electrically couple the respective plurality of conductive via pads and the second conductive layer.

In various embodiments, the ground area and each of the plurality of conducive via pads to which the voltage is applied respectively through the plurality of vias may serve to form a plurality of impedance elements.

In various embodiments, a distance between each of the plurality of via pads and the second conductive layer may correspond to a distance between the first conductive layer and the second conductive layer.

In various embodiments, the plurality of conductive via pads may be arranged with a rectangular shape. In various embodiments, a plurality of structures configured with the respective plurality of conductive via pads and the ground area may be used to filter out noise on a mmWave band.

Methods based on the embodiments disclosed in the claims and/or specification of the disclosure can be implemented in hardware, software, or a combination of both.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) can be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. Alternatively, the program can be stored in a memory configured in combination of all or some of these storage media. In addition, the configured memory can be plural in number.

Further, the program can be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device can have an access to a device for performing an embodiment of the present disclosure via an external port. In addition, an additional storage device on a communication network can have an access to the device for performing the embodiment of the disclosure.

In the aforementioned specific embodiments of the disclosure, a component included in the disclosure is expressed in a singular or plural form according to the specific embodiment proposed herein. However, the singular or plural expression is selected properly for a situation proposed for the convenience of explanation, and thus the various embodiments of the disclosure are not limited to a single or a plurality of components. Therefore, a component expressed in a plural form can also be expressed in a singular form, or vice versa.

While the disclosure has been shown and described with reference to certain preferred embodiments thereof, it will be understood by those skilled in the art that various changes in form and details may be made therein without departing from the spirit and scope of the disclosure as defined by the appended claims. Therefore, the scope of the disclosure is defined not by the detailed description thereof but by the appended claims, and all differences within equivalents of the scope will be construed as being included in the disclosure.

The invention claimed is:

1. A Printed Circuit Board (PCB) comprising:
an insulating layer;
a first conductive layer disposed on the insulating layer and comprising a ground area and a plurality of openings, the plurality of openings filled with an insulating material, disposed within the ground area, the ground area surrounding the plurality of openings;
a second conductive layer disposed under the insulating layer and configured to apply voltage;
a plurality of conductive via pads surrounded by respective ones of the plurality of openings; and
a plurality of conductive vias disposed in the insulating layer, and configured to electrically couple the respective ones of the plurality of conductive via pads and the second conductive layer,
wherein the plurality of conductive via pads are electrically separated from the ground area, by the respective ones of the plurality of openings; and
wherein the ground area of the first conductive layer is electrically separated from the second conductive layer.

2. The PCB of claim 1, wherein the first conductive layer, the second conductive layer, and the insulating layer are positioned in parallel with each other.

3. The PCB of claim 1, wherein a distance between the plurality of conductive via pads and the second conductive layer corresponds to a distance between the first conductive layer and the second conductive layer.

4. The PCB of claim 1, wherein the voltage is applied to at least one conductive via of the plurality of conductive vias and at least one conductive via pads of the plurality of conductive via pads.

5. The PCB of claim 4, wherein the at least one conductive via pad of the plurality of conductive via pads to which the voltage is applied and the ground area serve to form a capacitive element.

6. The PCB of claim 5, further comprising a first chip, wherein the capacitive element is used to decrease noise included in a signal transmitted from the first chip to a second chip differentiated from the first chip.

7. The PCB of claim 6, wherein the signal is related to a mmWave band.

8. The PCB of claim 1, wherein a shape of the plurality of openings corresponds to a shape of the respective ones of the plurality of conductive via pad.

* * * * *